(12) United States Patent
Wu et al.

(10) Patent No.: US 9,252,015 B2
(45) Date of Patent: Feb. 2, 2016

(54) ULTRA-SHALLOW JUNCTION SEMICONDUCTOR FIELD-EFFECT TRANSISTOR AND METHOD OF MAKING

(71) Applicant: Fudan University, Shanghai (CN)

(72) Inventors: Dongping Wu, Shanghai (CN); Xiangbiao Zhou, Shanghai (CN); Peng Xu, Shanghai (CN); Wei Zhang, Shanghai (CN); Shi-Li Zhang, Stockholm (SE)

(73) Assignee: FUDAN UNIVERSITY, Shanghai (CN)

( * ) Notice: Subject to any disclaimer, the term of this patent is extended or adjusted under 35 U.S.C. 154(b) by 0 days.

(21) Appl. No.: 13/704,598

(22) PCT Filed: Dec. 12, 2012

(86) PCT No.: PCT/CN2012/086449
§ 371 (c)(1),
(2) Date: May 30, 2014

(87) PCT Pub. No.: WO2014/089780
PCT Pub. Date: Jun. 19, 2014

(65) Prior Publication Data
US 2014/0306271 A1    Oct. 16, 2014

(51) Int. Cl.
*H01L 21/225*   (2006.01)
*H01L 29/78*    (2006.01)
*H01L 29/66*    (2006.01)

(52) U.S. Cl.
CPC .......... *H01L 21/225* (2013.01); *H01L 21/2254* (2013.01); *H01L 29/665* (2013.01); *H01L 29/66575* (2013.01); *H01L 29/78* (2013.01)

(58) Field of Classification Search
CPC . H01L 21/225; H01L 29/78; H01L 29/66575; H01L 21/2254; H01L 29/665; H01L 21/22; H01L 21/2215; H01L 21/2252; H01L 21/24; H01L 21/242
See application file for complete search history.

(56) References Cited

U.S. PATENT DOCUMENTS

| | | | | |
|---|---|---|---|---|
| 6,096,599 A | * | 8/2000 | Kepler | H01L 21/2257 257/E21.151 |
| 6,281,126 B1 | * | 8/2001 | Arakawa | H01L 21/32053 257/E21.296 |
| 7,033,916 B1 | * | 4/2006 | Pelella | H01L 21/26506 257/E21.165 |
| 2007/0209930 A1 | * | 9/2007 | Chua | C23C 8/10 204/298.02 |
| 2009/0184399 A1 | * | 7/2009 | Kowalski | H01L 21/324 257/618 |

* cited by examiner

*Primary Examiner* — Julio J Maldonado
*Assistant Examiner* — Farun Lu
(74) *Attorney, Agent, or Firm* — Jamie J. Zheng, Esq.

(57) ABSTRACT

An ultra-shallow junction semiconductor field-effect transistor and its methods of making are disclosed. In the present disclosure, a mixture film is formed on a semiconductor substrate with a gate structure formed thereon using a physical vapor deposition (PVD) process, which employs a mixture of metal and semiconductor dopants as a target. The PVD process is followed by annealing, during which ultra-shallow junctions and ultra-thin metal silicide are formed. After removing the mixture film remaining on the semiconductor substrate, an ultra-shallow junction semiconductor field-effect transistor is formed. Because the mixture film comprises metal and semiconductor dopants, ultra-shallow junctions and ultra-thin metal silicide can be formed in a same annealing process. The ultra-shallow junction thus formed can be used in semiconductor field-effect transistors for the 14 nm, 11 nm, or even further technology node.

14 Claims, 5 Drawing Sheets

ULTRA-SHALLOW JUNCTION SEMICONDUCTOR FIELD-EFFECT TRANSISTOR AND METHOD OF MAKING

FIELD

The present disclosure is related to semiconductor technology, and more particularly to an ultra-shallow junction semiconductor field-effect transistor and method of making.

DESCRIPTION OF RELATED ART

With the advances in the semiconductor industry and associated technology innovations, feature sizes of semiconductor devices are becoming smaller and smaller. As the horizontal or lateral dimension of a device continues to shrink, the vertical dimension (i.e., the device depth) is also being reduced proportionally. Particularly, after passing the 65 nm technology node, the source/drain regions and the source/drain extensions are required to be become shallower accordingly. Doped junctions with a junction depth of less than 100 nm is usually referred to as an ultra-shallow junction (USJ). Ultra-shallow junctions can improve the short channel effect of the device. As ultra-shallow junctions become shallower and shallower, how to resolve the conflict between reducing serial parasitic resistance and further decreasing the junction depths for the ultra-shallow junctions becomes a main challenge faced by ultra-shallow junction technologies.

Conventionally, ion implantation technology is usually used to form ultra-shallow junctions, such as highly doped source/drain regions of a metal oxide semiconductor (MOS) transistor. Using the gate structure as a mask, PN junctions can be formed by implanting N-type or P-type dopants into the semiconductor substrate. A metal film can be subsequently deposited, followed by annealing, during which metal silicide is formed, and wet etching is then used to remove any excess or remaining metal. As the transistor size shrinks, the gate length also decreases. With the continually decreasing gate length, the source/drain and source/drain extension regions need to become more and more shallow accordingly.

Currently, ultra-low energy ion implantation and millisecond laser annealing technologies are used to form ultra-shallow junctions. In the future, the junction depth of ultra-shallow junctions in semiconductor field-effect transistors can become smaller than 10 nm. Because of the immense challenges faced by the ultra-low energy ion implantation technologies and the generally occurring dopant diffusions during annealing and dopant activation, using conventional ultra-low energy ion implantation and annealing technologies to form ultra-shallow junctions suitable for field-effect transistors of future technology nodes shall face insurmountable challenges.

SUMMARY

The present disclosure provides a method of making an ultra-shallow junction semiconductor field-effect transistor, capable of forming ultra-shallow junctions in semiconductor field-effect transistors for the 14 nm, 11 nm, or even further technology node.

According to one embodiment, a method of making an ultra-shallow junction semiconductor field-effect transistor comprises:

A. forming a gate structure on a semiconductor substrate;
B. using the gate structure as a mask, and using a metal and semiconductor dopant mixture as a target, depositing a film of the mixture on the semiconductor substrate by physical vapor deposition;
C. performing annealing on the semiconductor substrate with the film of the mixture deposited thereon, to form metal silicide and ultra-shallow junctions, the ultra-shallow junction being a PN junction or a metal-semiconductor junction; and
D. removing the film of the mixture remaining on a surface of the semiconductor substrate.

Embodiments of the present invention also provide an ultra-shallow junction semiconductor field-effect transistor having a semiconductor substrate, a gate structure, ultra-shallow junctions, and metal silicide;

wherein, the gate structure is disposed on the semiconductor substrate; and wherein the ultra-shallow junctions and the silicide are formed using a physical vapor deposition (PVD) process followed by annealing, the PVD process employing a metal and semiconductor dopant mixture as a target and depositing a film of the mixture on the semiconductor substrate using the gate structure as a mask.

The ultra-shallow junctions are PN junctions or metal semiconductor junctions.

Compared to conventional technologies, embodiments of the present disclosure form ultra-shallow junctions and ultra-thin metal-semiconductor compound films using a physical vapor deposition (PVD) process followed by annealing. The PVD process employs a metal and semiconductor dopant mixture as a target and deposits a film of the mixture on the semiconductor substrate with a gate structure formed thereon. During annealing of the semiconductor substrate with the film of the mixture deposited thereon, metal-semiconductor compound and ultra-shallow junctions are formed. After removing the film of the mixture remaining on the semiconductor substrate, an ultra-shallow junction semiconductor field-effect transistor is formed. Because the metal and semiconductor dopant mixture is used as a target to deposit the mixture film, and ultra-shallow junctions and ultra-thin metal-semiconductor compound films are formed in the same annealing process, the ultra-shallow junctions can be used in semiconductor field-effect transistors for the 14 nm, 11 nm, or even further technology node.

In one embodiment, the semiconductor substrate is a silicon or silicon-on-insulator substrate and the metal-semiconductor compound film comprises metal silicide.

Furthermore, in Step C above, microwave annealing can be used. In one embodiment, the microwave annealing is performed in a microwave chamber using multi-mode and multi-frequency electro-magnetic waves.

By using microwave annealing technology, metal silicide and ultra-shallow junctions can be formed under relatively low temperature, resulting in the metal silicide to exist stably.

Furthermore, in the above Step B, the target material can be ionized into an ionic state, causing it to produce metal ions and semiconductor dopant ions. Also, a substrate bias voltage can be applied to the semiconductor substrate. Ionizing the target material into an ionic state can be done by applying a first bias voltage onto the target.

To deposit the film of the metal and semiconductor dopant mixture, ionizing the target and applying a substrate bias voltage on the semiconductor substrate can cause, on one hand, metal ions and semiconductor dopant ions to diffuse to a certain depth after being accelerated toward and deposited on the semiconductor substrate. On the other hand, the uniformity and stability of the thin film deposited on the three-dimensional structure can be enhanced.

DETAILED DESCRIPTION OF THE EMBODIMENTS

Various embodiments of the present disclosure are explained in detail with reference to the drawings. Those of ordinary skill in the art should understand, however, that many technical details are set forward in the various embodiments in order for the readers to better understand the present disclosure. The technology schemes claimed to be protected by the appended claims, however, can be implemented without such technical details, by making proper modifications and changes to the various embodiments.

Figure 1:
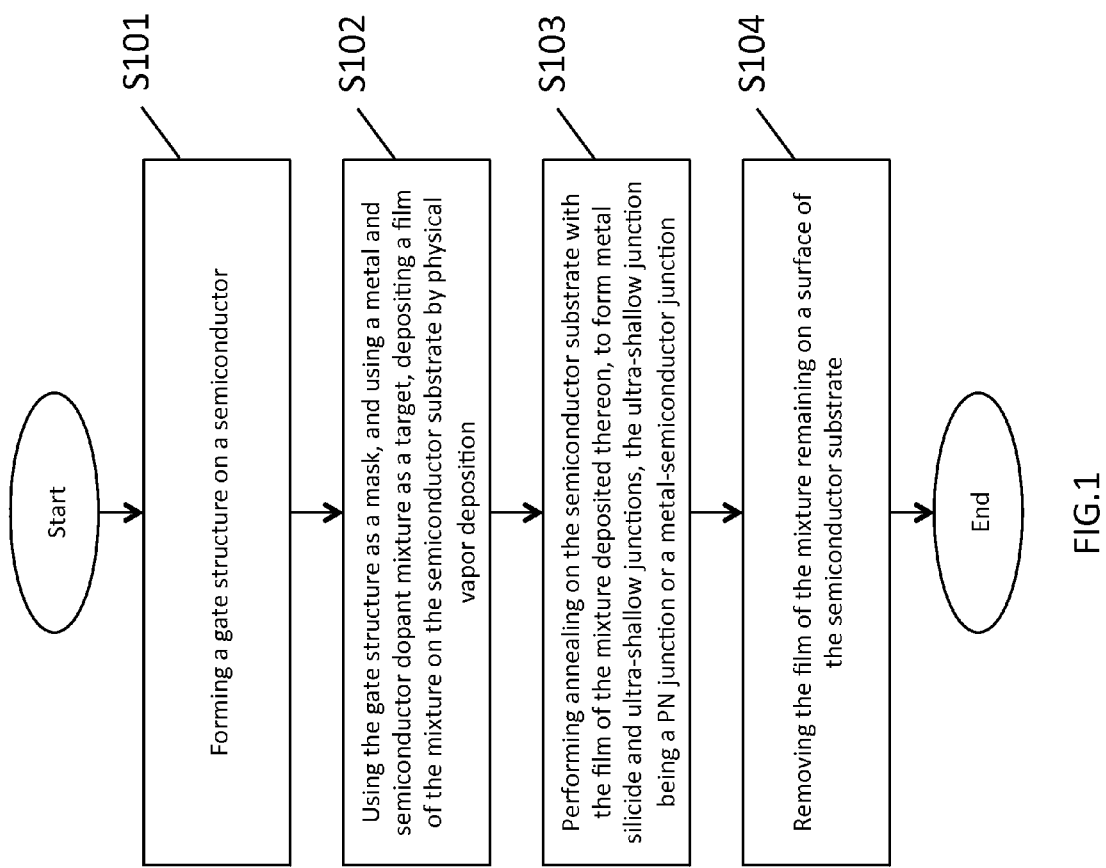
FIG. 1 is a method of making an ultra-shallow junction semiconductor field-effect transistor according to one embodiment of the present invention

According to one embodiment of the present disclosure, as illustrated in the flowchart in FIG. 1, a method of making an ultra-shallow junction semiconductor field-effect transistor comprises the following process steps.

Figure 2A:
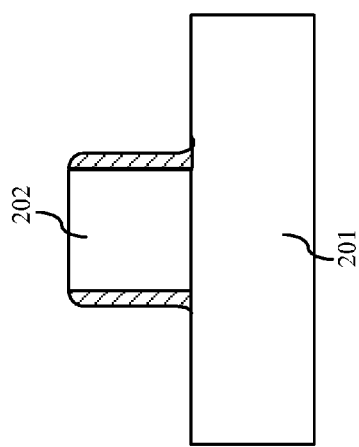
FIGS. 2A to 2E are cross-sectional diagrams illustrating various steps in the method of making an ultra-shallow junction semiconductor field-effect transistor according to one embodiment of the present invention.

In Step 101, a semiconductor substrate (such as a silicon or silicon-on-insulator (SOI) substrate) is provided and a gate structure is formed on the semiconductor substrate. As shown in FIG. 2A, a gate structure 202 is formed over a semiconductor substrate 201. The semiconductor substrate can include silicon (Si), germanium (Ge), silicon-germanium alloy (SiGe), and/or any of the III-V semiconductors. The gate structure may include a gate dielectric, a gate electrode, and spacers along sidewalls of the gate electrode and the gate dielectric, and can be formed using conventional technologies, detailed description of which is omitted here.

Figure 2B:
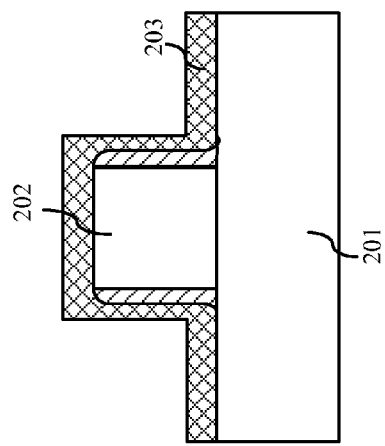
Figure 2C:
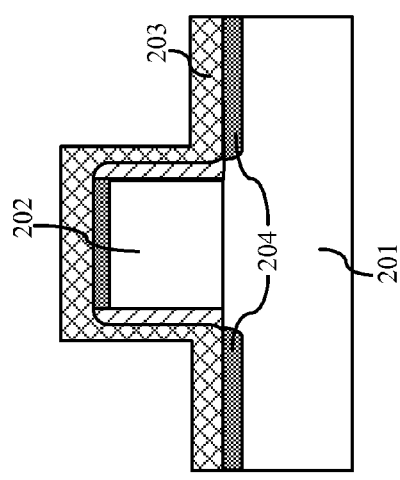

In Step 102, using the gate structure as a mask and a metal and semiconductor dopant mixture as a target, a film of the mixture is deposited on a semiconductor substrate by physical vapor deposition (PVD). As shown in FIG. 2B, a film of the mixture 203 is formed.

Figure 3:
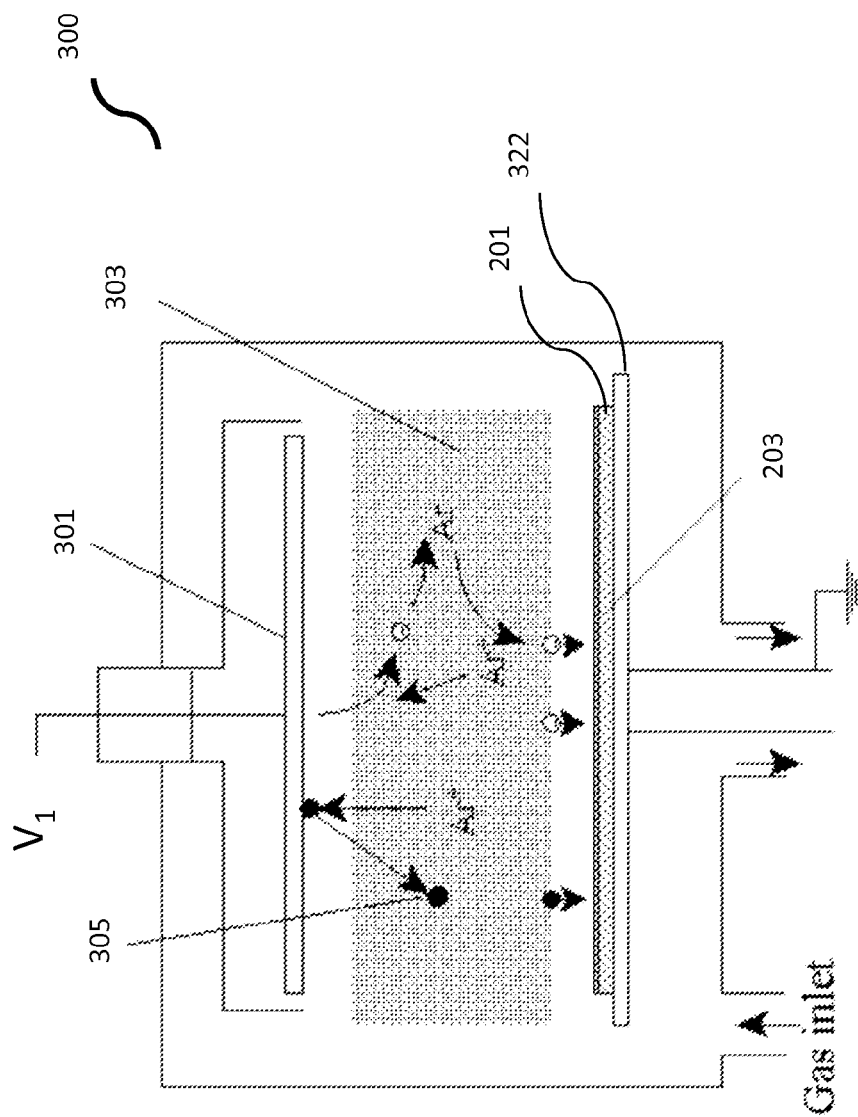
FIG. 3 is a schematic block diagram illustrating a physical vapor deposition (PVD) chamber that can be employed to deposit a mixture film of metal and semiconductor dopants on a semiconductor substrate.

Physical vapor deposition (PVD) is a known technique used in the manufacture of integrated circuits. In PVD, a target of a desired coating material is caused to eject target material, which is then deposited onto a substrate. As shown in FIG. 3, which illustrate an exemplary PVD chamber, in one embodiment, the target 301 and the semiconductor substrate 201 with the gate structure 202 formed thereon are placed in a vacuum chamber 300, which is evacuated to and maintained at a very low pressure (e.g, less than 10 mTorr). In one embodiment, the target 301 is a metal-rich mixture in the form of polycrystalline solid material. The mixture can be made by mixing metal powder with semiconductor dopant powder followed by thermal and other treatments. The semiconductor dopants in the target are uniformly distributed within the metal.

In one embodiment, a heavy inert gas 303 such as argon is supplied to the vacuum chamber 310 and a pumping system (not shown) maintains the desired gas pressure in the chamber. Using conventional means, a glow discharge plasma can be created in the low pressure gas, at least partially ionizing the gas. If the target is properly biased, positive ions from the plasma can accelerate towards the target, resulting in the target material 305 being sputtered and ejected from the target. Some of the ejected target material is deposited onto the semiconductor substrate 201 to form the mixture film 203.

In one embodiment, a semiconductor dopant content of the metal and semiconductor dopant mixture is about 0.1 percent to about 5 percent. The metal can be any of nickel Ni, platinum Pt, titanium (Ti), cobalt (Co), tungsten (W) and Molybdenum (Mo) or a mixture or alloy of two or more thereof. While nickel is preferred for most applications, nickel is often mixed with Pt, W or other of the above metals for stability and Schottky barrier height tuning purpose. The semiconductor dopant can be one or more P-type dopants such as boron (B), boron fluoride (BF2), indium (Indium) or any mixture thereof; or one or more N-type dopants such as phosphorus (P), arsenic (As) or any mixture thereof.

In Step 103, annealing is performed on the semiconductor substrate with the film of the mixture deposited thereon to form metal silicide(s) and ultra-shallow junctions. The ultra-shallow junctions define the source/drain and/or source/drain extension regions on two-sides of a channel region under the gate structure.

Figure 2D:
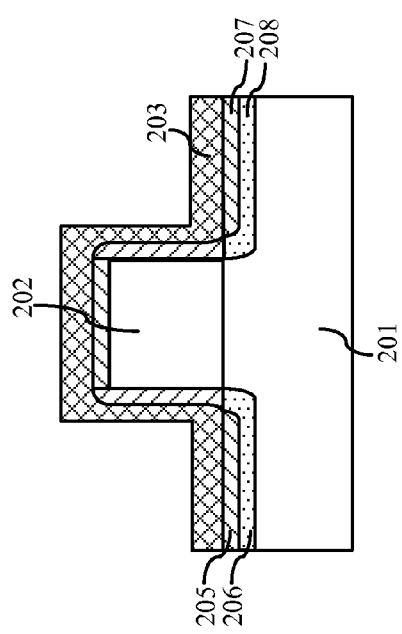

During annealing, metal in the mixture film 203 can react with the semiconductor substrate to form metal silicide(s). At the same time, the semiconductor dopants in the mixture film diffuse into the metal silicide(s), the interfaces between dopant diffusion regions and the semiconductor substrate, and into the semiconductor substrate, forming ultra-shallow junctions. As shown in FIG. 2D, reference numerals 205 and 207 denote contact regions of metal silicide(s) at the source and drain, respectively, while 206 and 208 denote dopant diffusion regions at the source and drain, respectively. Normally, dopant diffusion regions 206/208 should form P-N junctions with the semiconductor substrate, and metal silicide 205/207 form ohmic contacts with dopant diffusion regions 206/208. When the formed dopant diffusion regions 206 and 208 are sufficiently shallow (e.g., <1.5 nm), however, the metal silicide 206/208 can form metal-semiconductor contacts with the semiconductor substrate.

In one embodiment, a conventional rapid thermal annealing (RTP) process is used in Step 103. In a further embodiment, a microwave heating annealing process is used. The microwave heating annealing process can be used to form the metal silicide(s) and ultra-shallow junctions at relatively low temperature, resulting in stable metal silicide(s). Additionally, during the depotision of the mixture film on the semiconductor substrate, the substrate temperature should be between 0 to 300, while the annealing temperature can be between 200 to 800. In Step 103, metal and semiconductor dopants diffuse into the semiconductor substrate, forming metal silicide(s). During annealing, the semiconductor dopants in the metal silicide(s) continue to diffuse into the semiconductor substrate, thereby forming the ultra-shallow junctions. The temperature at which metal silicides are formed and stably exist is relatively low. For example, the temperatures at which nickel silicide (NiSi), cobalt silicide (CoSi), and titanium silicide (TiSi) can stably exist are less than 600, 700, and 1000° C., respectively. Therefore, when metal silicides and ultra-shallow junctions are formed under relatively low temperatures, it is possible that the semiconductor dopants in the semiconductor substrate are not fully activated. If they are fully activated, PN junctions should be formed. If they are not fully activated, metal semiconductor junctions (i.e., Schottky junctions) would be formed. Thus, in the process of forming ultra-shallow junctions and ultra-thin metal silicide(s), the ultra-shallow junctions formed may be PN junctions, or metal semiconductor junctions.

Note that by using microwave heating technology for annealing, metal silicide(s) and ultra-shallow junctions can be formed at relatively low temperature, and the metal silicide(s) can stably exist. Furthermore, different materials on the substrate absorb microwave energy differently and microwave heating is closely related to defects in the substrate. The existence of dopants in the semiconductor, and any semiconductor crystal lattice damages caused by other factors can be regarded as defects, which, can increase the ability to absorb microwave energy, i.e., the more defects, the higher the microwave heating efficiency. Thus, using microwave heating for annealing can enhance the heating efficiency.

Note that the mixture film includes metal and semiconductor dopants, during microwave heating annealing, multi-mode and multi-frequency microwaves are provided in a microwave-heating chamber in order to heat up both metal and semiconductor dopants. In one embodiment, a maximum temperature of the semiconductor substrate during annealing does not exceed 700° C. In one embodiment, medium (or peak) microwave frequencies are between 1.5 GHz and 15 GHz, so as to provide sufficient heating of the different materials. Furthermore, when performing microwave annealing, the micro electromagnetic waves should have a Gaussian distribution near about 5.8 GHz in a microwave-annealing chamber, and multiple microwave frequencies with intervals of about 30 Hz to about 50 Hz can be used. At the same time, the microwaves with the different frequencies should have multi-mode characteristics in the microwave annealing chamber, so as to insure heating consistency and uniform distribution of microwave energies in the microwave annealing chamber, leading to uniform and consistent heating of the substrate.

Figure 2E:
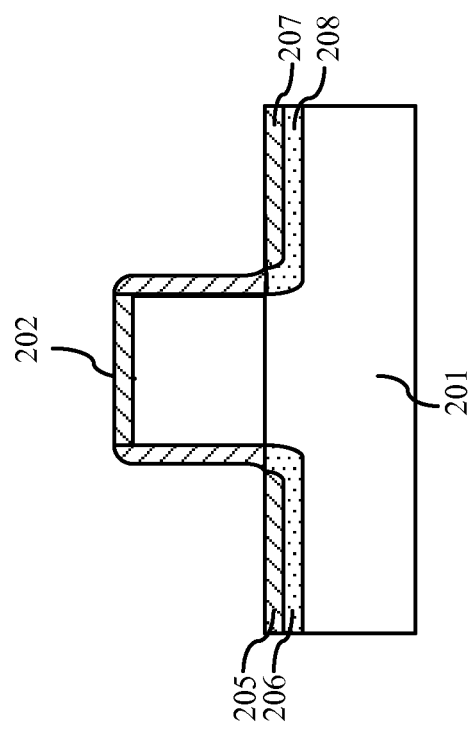

In Step 104, the mixture film remaining on the semiconductor substrate is removed, forming the ultra-shallow junction semiconductor field-effect transistor, as shown in FIG. 2E. Conventional wet etching technologies can be used to remove the mixture film remaining on the semiconductor substrate, which do not need to be described here.

Compared to conventional technologies, the present embodiments use a metal and semiconductor dopant mixture as a target, to deposit on a semiconductor substrate having a gate structure formed thereon, a film of the mixture by physical vapor deposition (PVD), and perform annealing on the semiconductor substrate subsequent to forming the film of the mixture, to form metal silicide and ultra-shallow junctions. After removing the film of the mixture remaining on the semiconductor substrate, an ultra-shallow junction semiconductor field-effect transistor is formed. Because the metal and semiconductor dopant mixture is used as a target to deposit the mixture film, ultra-shallow junctions and ultra-thin metal silicide(s) can be formed in a same annealing process The ultra-shallow junction thus formed can be used in semiconductor field-effect transistors for the 14 nm, 11 nm, or even further technology node.

According to an alternative embodiment, a method of making an ultra-shallow junction semiconductor field-effect transistor includes using high-power impulse magnetron sputtering (HiPIMS) technologies to perform PVD deposition, in which a target is ionized and substrate bias voltage is applied to a semiconductor substrate when a mixture film is deposited. On one hand, metal ions and semiconductor dopant ions can diffuse to a certain depth after being accelerated towards and deposited on the semiconductor substrate. On the other hand, the thin film deposited on a three dimensional structure can have enhanced uniformity and stability.

Specifically, in Step 102, the target material is ionized to form metal ions and semiconductor dopant ions, and a substrate bias is applied to the semiconductor substrate. In one embodiment, the target material is ionized to an ionic state by applying a first bias voltage $V_1$ to the target, as shown in FIG. 3.

The first bias voltage can be a direct current bias voltage, an alternating current bias voltage or a pulsed bias voltage. The magnitude of the first bias voltage is dependent on the type of PVD system used, i.e., the magnitude of the first bias voltage varies among different PVD systems. Generally, the first bias voltage should be about 200V to about 1000V, which, for an alternating current bias voltage or pulsed bias voltage, should be the root-mean-square (RMS) value. Also, the substrate bias voltage can be a direct current bias voltage, an alternating current bias voltage or a pulsed bias voltage. The magnitude of the substrate bias voltage is adjustable. By adjusting the substrate bias voltage, an amount of metal ions diffusing to a surface of the semiconductor substrate can be adjusted, resulting in a thickness of the eventually formed metal-semiconductor compound thin film to be adjustable. Generally, the substrate bias voltage is about 200V to about 1000V, which, for an alternating current bias voltage or pulsed bias voltage, should be the root-mean-square (RMS) value.

The above methods are divided in steps for ease of description. In practice, multiple steps can be combined into one step and certain step can be further divided into multiple steps.

As shown in FIG. 2E, an ultra-shallow junction semiconductor field-effect transistor according to one embodiment of the present invention comprises a semiconductor substrate, a gate structure, ultra-shallow junctions, and ultra-thin metal silicides. The gate structure is disposed on the semiconductor substrate. The ultra-shallow junction and ultra-thin metal silicides are formed by depositing a mixture film on the semiconductor substrate using a physical vapor deposition (PVD) process, which is followed by annealing. During the PVD process, the gate structure is used as a mask, and a mixture of metal and semiconductor dopants is used as a target. The ultra-shallow junctions are PN junctions or metal-semiconductor junctions.

In one embodiment, the content of semiconductor dopants in the mixture of metal and semiconductor dopants is about 0.1% to about 5%. The metal can be any of nickel Ni, platinum Pt, titanium (Ti), cobalt (Co), tungsten (W) and Molybdenum (Mo) or a mixture or alloy of two or more thereof. The semiconductor dopant can be one or more P-type dopants such as boron (B), boron fluoride (BF2), indium (Indium) or an mixture thereof; or one or more N-type dopants such as phosphorus (P), arsenic (As) or any mixture thereof. In one embodiment, the metal silicide have a thickness of about 5-20 nm; the ultra-shallow junctions has a depth about 1-15 nm; a peak doping concentration in the ultra-shallow junctions in the source/drain regions is about $2e^{19}$-$2e^{20}$/cm$^3$, and the gate structure has a gate length of about 7-25 nm.

The embodiment of the ultra-shallow junction semiconductor field-effect transistor corresponds to the above embodiments of the methods of making the ultra-shallow junction transistors. Thus, some of the details in the above-described method embodiments, which are applicable to the transistor embodiment, are not repeated. Correspondingly, any details related to the transistor embodiment can also be applicable to the description of the above method embodiments.

Those of ordinary skill in the art can understand that the above descriptions are related to specific embodiments of the present invention, and various modifications in form and detail can be made in practice without departing from the spirit and scope of the present invention.

We claim:

1. A method of making an ultra-shallow junction semiconductor field-effect transistor, comprising:
   A. forming a gate structure on a semiconductor substrate;
   B. using the gate structure as a mask, and using a metal and semiconductor dopant mixture as a target, depositing a film of the mixture on the semiconductor substrate by physical vapor deposition;
   C. performing annealing on the semiconductor substrate with the film of the mixture deposited thereon, to form metal silicide and ultra-shallow junctions, the ultra-shallow junction being a PN junction or a metal-semiconductor junction; and
   D. removing the film of the mixture remaining on a surface of the semiconductor substrate.

2. The method of claim 1, wherein a conventional rapid thermal annealing (RIP) process or a microwave heating annealing is used in Step C.

3. The method of claim 2, wherein during microwave annealing, multi-mode and multi-frequency microwaves are provided in a microwave-heating chamber to heat up both metal and semiconductor dopants in the film of the mixture.

4. The method of claim 3, wherein during microwave annealing, microwave frequencies are between 1.5 GHz and 15 GHz, and the microwave annealing lasts about 1 minute to about 30 minutes.

5. The method of claim 1, wherein in step B, a target material is ionized into an ionic state, causing it to produce metal ions and semiconductor dopant ions, and wherein a substrate bias voltage is applied to the semiconductor substrate.

6. The method of claim 5, a first bias voltage is applied to the target to ionize the target material into an ionic state.

7. The method of claim 6, wherein the first bias voltage is one of a direct current bias voltage, an alternating current bias voltage and a pulsed bias voltage.

8. The method of claim 5, wherein the substrate bias voltage is one of a direct current bias voltage, an alternating current bias voltage and a pulsed bias voltage.

9. The method according to claim 1, wherein the metal is any of nickel (Ni), platinum (Pt), titanium (Ti), cobalt (Co), tungsten (W) and Molybdenum (Mo) or a mixture or alloy of two or more thereof.

10. The method according to claim 1, wherein the semiconductor dopant can be one or more P-type dopants such as boron (B), boron fluoride ($BF_2$), indium (Indium) or any mixture thereof; or one or more N-type dopants such as phosphorus (P), arsenic (As) or any mixture thereof.

11. The method according to claim 1, wherein a semiconductor dopant content in the mixture of metal and semiconductor dopants is about 0.1 percent to about 5 percent.

12. The method according to claim 1, wherein the semiconductor substrate includes silicon (Si), germanium (Ge), silicon-germanium alloy (SiGe), and/or any of the III-V semiconductors.

13. The method according to claim 1, wherein the semiconductor substrate is at a temperature between 0 and 300° C. during deposition of the mixture film on the semiconductor substrate in step B.

14. The method according to claim 1, wherein an annealing temperature is between 300 to 800° C. in step C.

* * * * *